(12) United States Patent
Hattori

(10) Patent No.: US 11,599,195 B2
(45) Date of Patent: Mar. 7, 2023

(54) STRUCTURE AND TACTILE SENSATION PROVIDING APPARATUS

(71) Applicant: KYOCERA Corporation, Kyoto (JP)

(72) Inventor: Shigeto Hattori, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/056,979

(22) PCT Filed: May 9, 2019

(86) PCT No.: PCT/JP2019/018538
§ 371 (c)(1),
(2) Date: Nov. 19, 2020

(87) PCT Pub. No.: WO2019/225333
PCT Pub. Date: Nov. 28, 2019

(65) Prior Publication Data
US 2021/0240269 A1 Aug. 5, 2021

(30) Foreign Application Priority Data
May 23, 2018 (JP) .............................. JP2018-098586

(51) Int. Cl.
*G06F 3/01* (2006.01)
*G06F 3/041* (2006.01)
*B60K 35/00* (2006.01)

(52) U.S. Cl.
CPC .............. *G06F 3/016* (2013.01); *G06F 3/041* (2013.01); *B60K 35/00* (2013.01); *B60K 2370/143* (2019.05); *B60K 2370/158* (2019.05); *B60K 2370/166* (2019.05); *B60K 2370/782* (2019.05)

(58) Field of Classification Search
CPC .............................. G06F 3/016; G06F 3/0416
See application file for complete search history.

(56) References Cited

U.S. PATENT DOCUMENTS

| | | | | |
|---|---|---|---|---|
| 5,324,902 A * | 6/1994 | Shen | ................... | H01H 13/705 200/516 |
| 5,670,759 A * | 9/1997 | Hsu | ...................... | H01H 13/705 200/345 |
| 2010/0156843 A1 | 6/2010 | Paleczny et al. | | |
| 2010/0177050 A1 | 7/2010 | Heubel et al. | | |
| 2010/0328230 A1 * | 12/2010 | Faubert | .................. | G06F 3/041 345/173 |
| 2011/0102341 A1 | 5/2011 | Imai et al. | | |
| 2014/0320436 A1 * | 10/2014 | Modarres | ................ | G06F 1/163 345/173 |
| 2019/0074425 A1 | 3/2019 | Nakao | | |

FOREIGN PATENT DOCUMENTS

| | | |
|---|---|---|
| EP | 3 220 232 A1 | 9/2017 |
| JP | 2011-113461 A | 6/2011 |
| JP | 2013-149124 A | 8/2013 |
| JP | 2017-175874 A | 9/2017 |
| WO | 2010/150563 A1 | 12/2010 |

* cited by examiner

*Primary Examiner* — Nan-Ying Yang
(74) *Attorney, Agent, or Firm* — Studebaker & Brackett PC

(57) ABSTRACT

An improved structure and tactile sensation providing apparatus are provided. A structure is configured to provide a tactile sensation. The structure comprises an abutment configured to abut an actuator that causes the structure to vibrate according to expansion and contraction displacement of a piezoelectric element. The abutment is non-adherent to the actuator.

4 Claims, 9 Drawing Sheets

FIG. 1
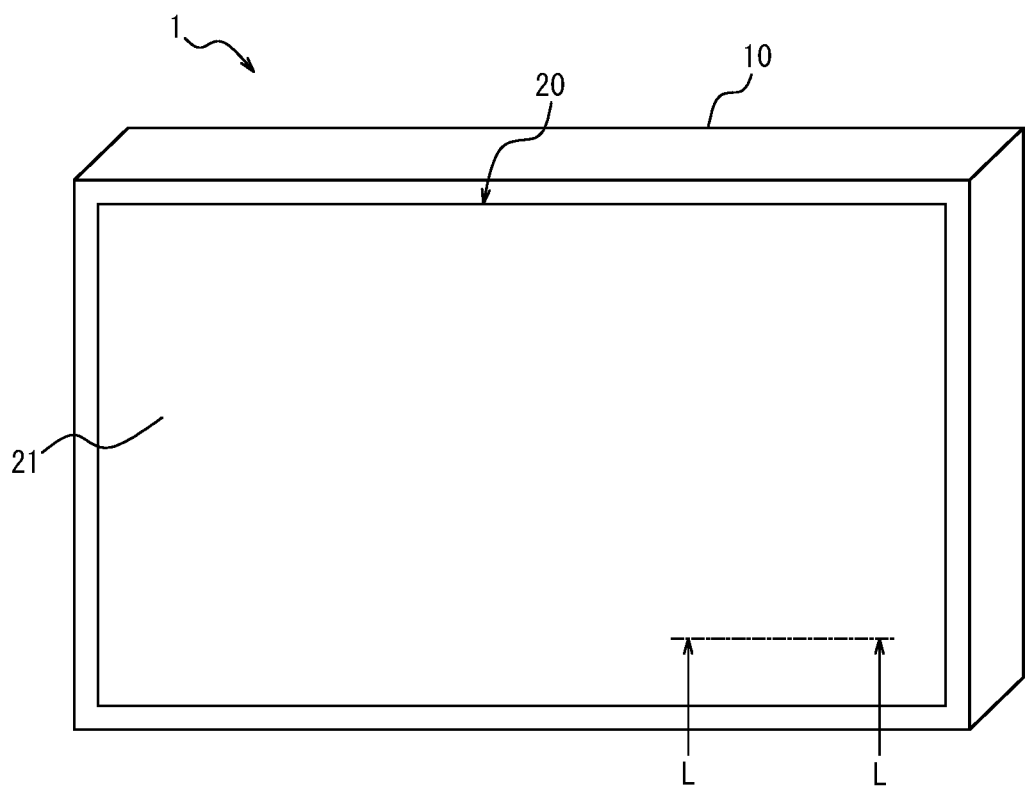
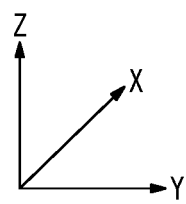

STRUCTURE AND TACTILE SENSATION PROVIDING APPARATUS

CROSS REFERENCE TO RELATED APPLICATION

This application claims priority to and the benefit of Japanese Patent Application No. 2018-098586 filed on May 23, 2018, the entire disclosure of which is incorporated herein by reference.

TECHNICAL FIELD

The present disclosure relates to a structure and a tactile sensation providing apparatus.

BACKGROUND

Apparatuses for providing a tactile sensation to a user touching a vibration object such as a touch sensor by causing the vibration object to vibrate by a piezoelectric element are conventionally known.

SUMMARY

A structure according to an aspect is a structure configured to provide a tactile sensation. The structure comprises an abutment configured to abut an actuator that causes the structure to vibrate according to expansion and contraction displacement of a piezoelectric element. The abutment is non-adherent to the actuator.

A tactile sensation providing apparatus according to an aspect comprises: a structure configured to provide a tactile sensation; and an actuator configured to cause the structure to vibrate according to expansion and contraction displacement of a piezoelectric element. The structure includes an abutment configured to abut the actuator. The abutment is non-adherent to the actuator.

BRIEF DESCRIPTION OF THE DRAWINGS

In the accompanying drawings:

FIG. 1 is an appearance diagram of a tactile sensation providing apparatus according to an embodiment of the present disclosure;

DETAILED DESCRIPTION

According to the present disclosure, an improved structure and tactile sensation providing apparatus can be provided.

Figure 2:
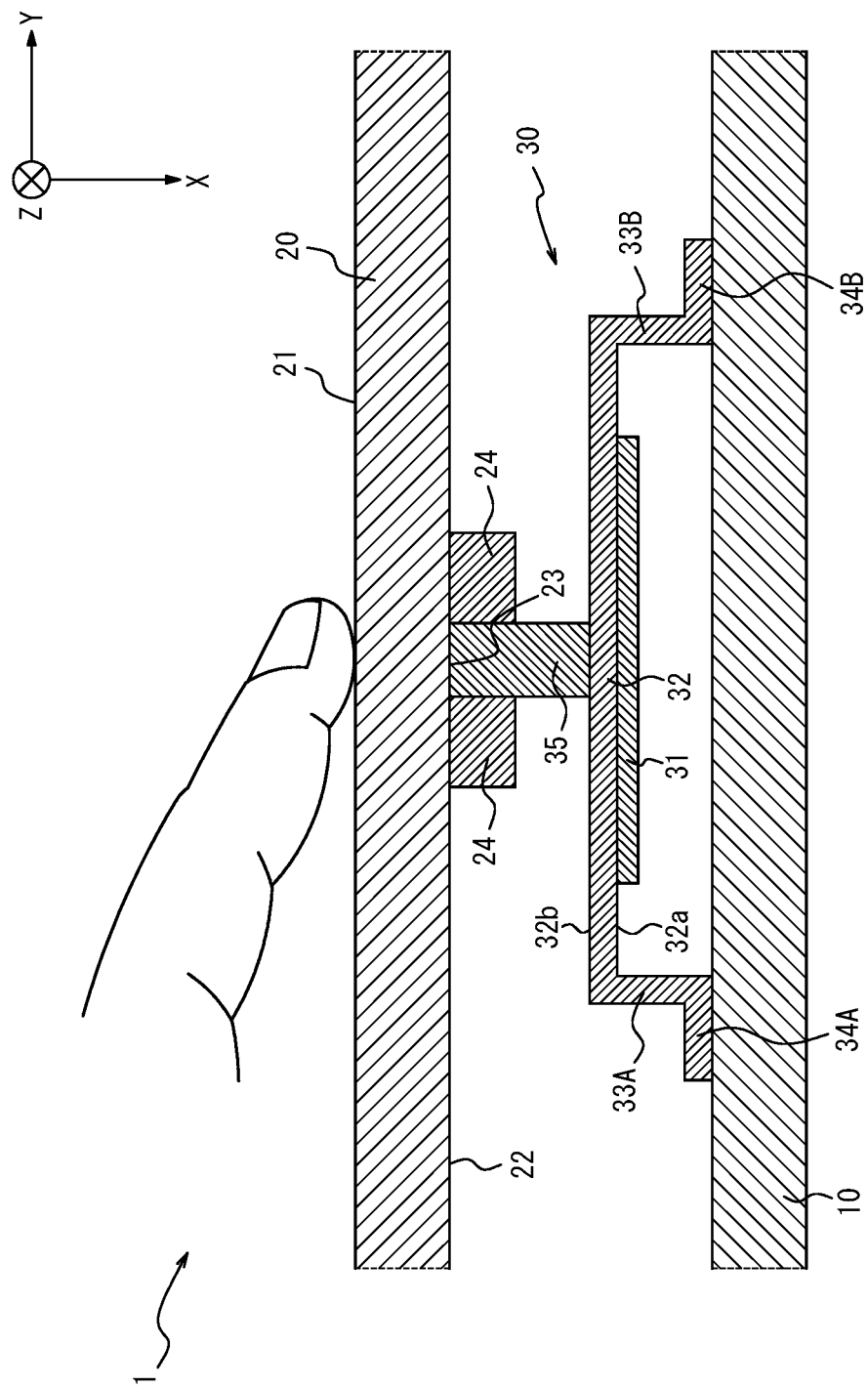
FIG. 2 is an XY-plane sectional diagram of the tactile sensation providing apparatus along line L-L in FIG. 1.
Figure 3:
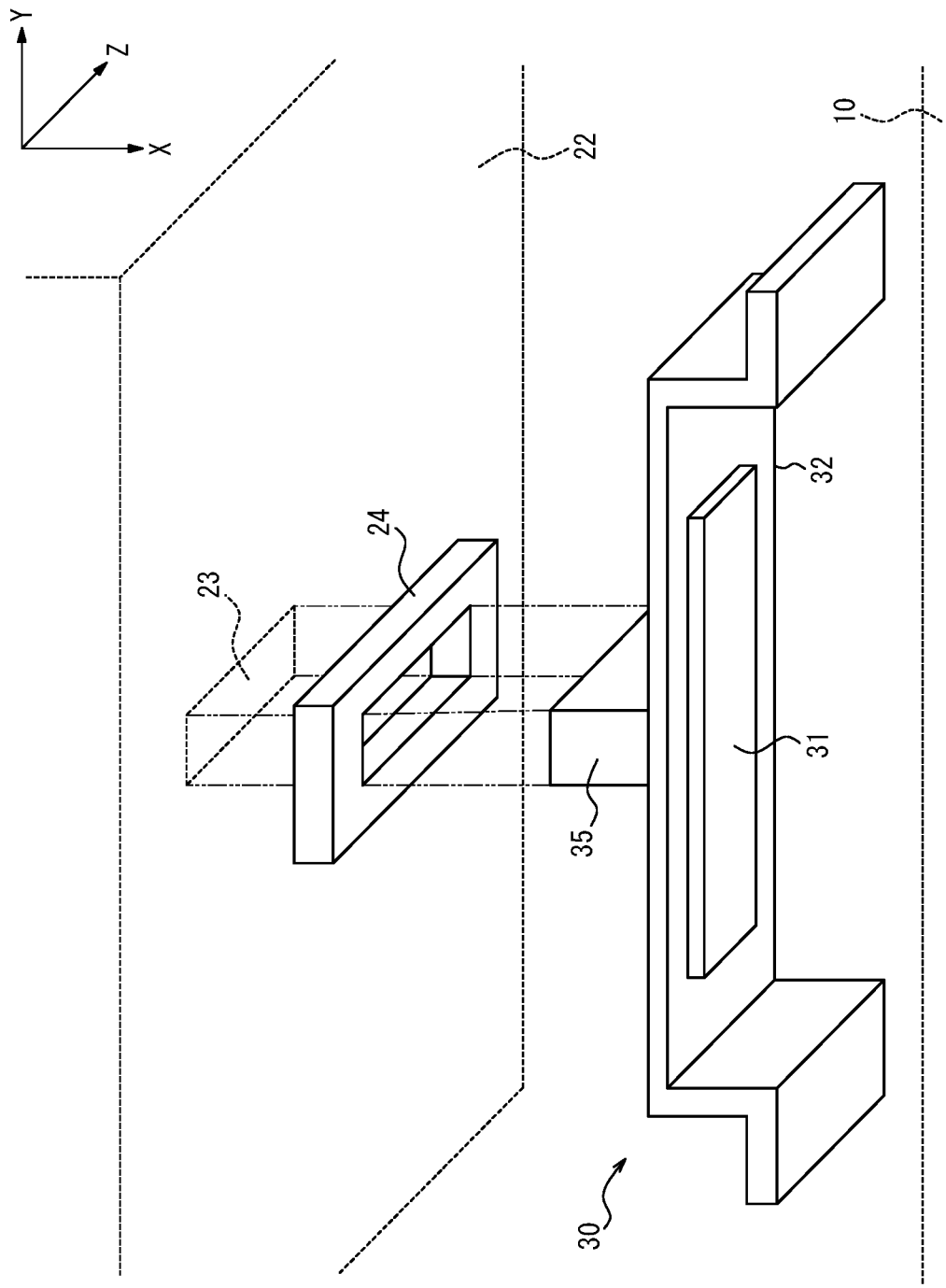
FIG. 3 is an exploded perspective diagram of the configuration illustrated in FIG. 2.

FIG. 1 is an appearance diagram of a tactile sensation providing apparatus 1 according to an embodiment of the present disclosure. FIG. 2 is an XY-plane sectional diagram of the tactile sensation providing apparatus 1 along line L-L in FIG. 1. FIG. 3 is an exploded perspective diagram of the configuration illustrated in FIG. 2. As illustrated in FIG. 1, the tactile sensation providing apparatus 1 has a rectangular parallelepiped shape in appearance. In FIGS. 1 to 3, the thickness direction of the tactile sensation providing apparatus 1 is an X-axis direction, the longitudinal direction of the tactile sensation providing apparatus 1 is a Y-axis direction, and the transverse direction of the tactile sensation providing apparatus 1 is a Z-axis direction.

As illustrated in FIG. 2, the tactile sensation providing apparatus 1 includes a housing 10, a vibration object 20 (structure), and an actuator 30. The tactile sensation providing apparatus 1 provides a tactile sensation to a user touching a main surface 21 of the vibration object 20, by vibrating the vibration object 20. Examples of the tactile sensation providing apparatus 1 include vehicle-mounted devices such as a car navigation system and switches of a steering wheel and a power window. Examples of the tactile sensation providing apparatus 1 also include a mobile phone, a smartphone, a tablet personal computer (PC), and a laptop PC. The tactile sensation providing apparatus 1 is not limited to such. The tactile sensation providing apparatus 1 may be any of various electronic devices such as a desktop PC, a household appliance, an industrial device (factory automation (FA) device), and a dedicated terminal.

The housing 10 may be made of metal, synthetic resin, or the like. The housing 10 protects the internal structure of the tactile sensation providing apparatus 1. The housing 10 may contain the actuator 30, a controller, a memory, and the like. The controller may include a processor, a microcomputer, or the like capable of executing application software. The controller is connected to the actuator 30. The controller outputs a drive signal for vibrating the actuator 30, to the actuator 30. The drive signal may be a voltage signal or a current signal. The memory may include a semiconductor memory, a magnetic memory, or the like. The memory stores various information, programs for operating the controller, and the like. The controller and the memory may be provided outside the housing 10.

The vibration object 20 vibrates as a result of the vibration of the actuator 30 being transmitted. The vibration object 20 may be a touch sensor provided in a display panel. The vibration object 20 is not limited to a touch sensor, and may be, for example, a switch.

The vibration direction of the vibration object 20 includes, for example, an in-plane direction and an out-of-plane direction. The in-plane direction is a direction substantially parallel to the main surface 21 of the vibration object 20. In FIG. 1, for example, the in-plane direction is a direction parallel to the ZY plane. Hence, in FIG. 1, vibration in the in-plane direction is, for example, vibration in the Z-axis direction. The out-of-plane direction is a direction orthogonal to the main surface 21 of the vibration object 20. Hence, in FIG. 1, vibration in the out-of-plane direction is vibration in the X-axis direction. Hereafter, vibration in the in-plane direction is also referred to as "horizontal vibration", and vibration in the out-of-plane direction is also referred to as "vertical vibration".

The vibration direction of the vibration object 20 may be set as appropriate depending on, for example, the use of the tactile sensation providing apparatus 1. For example, in the case where the tactile sensation providing apparatus 1 is a vehicle-mounted device, the vibration object 20 may be a display of a car navigation system. The traveling direction of the vehicle in which the tactile sensation providing apparatus 1 is mounted can be approximately the X-axis direction. In this case, the vibration direction of the vibration object 20 may be determined as the out-of-plane direction. In the case where the vibration direction of the vibration object 20 is set to the out-of-plane direction, the actuator 30 can be incorporated in the tactile sensation providing apparatus 1 as illustrated in FIG. 2.

The vibration object 20 has the main surface 21, a main surface 22, and an abutment 23. The vibration object 20 may further have a guide 24. The guide 24 may be formed integrally with the vibration object 20. Alternatively, the guide 24 may be formed separately from the vibration object 20. In the case where the guide 24 is formed separately from the vibration object 20, the guide 24 may be provided on the main surface 22 using an adhesive or the like.

The main surface 21 faces the outside of the tactile sensation providing apparatus 1, as illustrated in FIG. 1. The main surface 21 is touched by the user. The main surface 22 faces the inside of the tactile sensation providing apparatus 1, as illustrated in FIG. 2. The main surface 22 faces the bottom of the housing 10.

The abutment 23 can abut a holder 35 of the actuator, as illustrated in FIG. 2. The abutment 23 may be a region of part of the main surface 22, as illustrated in FIG. 3. The shape of the abutment 23 may be the same as the shape of the surface of the holder 35 of the actuator 30 facing the vibration object 20. As a result of the abutment 23 abutting the holder 35 of the actuator 30, the vibration of the actuator 30 can be transmitted to the vibration object 20.

The abutment 23 is non-adherent to the holder 35 of the actuator 30. The abutment 23 may be removable from the holder 35 of the actuator 30. With such a configuration, when an external force in the negative direction of the X-axis acts on the vibration object 20, the holder 35 can separate from the 10 abutment 23, so that damage of the piezoelectric element 31 can be prevented. This will be described in detail later with reference to FIG. 4.

The guide 24 guides the holder 35 of the actuator 30 to the abutment 23 of the vibration object 20. The guide 24 may be provided on the main surface 22, as illustrated in FIGS. 2 and 3. The guide 24 may be formed along the whole periphery of the holder 35 of the actuator 30, as illustrated in FIG. 3. Alternatively, the guide 24 may be formed along part of the periphery of the holder 35 of the actuator 30. The guide 24 may be made of metal, resin, or a composite material of metal, resin, and the like.

The inner wall of the guide 24 can be in contact with the holder 35 of the actuator 30. The inner wall of the guide 24 may be treated so that friction will occur between the inner wall of the guide 24 and the holder 35. As a result of friction occurring between the inner wall of the guide 24 and the holder 35 of the actuator 30, the vibration of the actuator 30 can be efficiently transmitted to the vibration object 20.

The actuator 30 converts a voltage signal output from the controller of the tactile sensation providing apparatus 1, into vibration. The actuator 30 may be located at four corners of the tactile sensation providing apparatus 1 having a rectangular parallelepiped shape illustrated in FIG. 1. The actuator 30 may be located between the bottom surface of the housing 10 and the vibration object 20, as illustrated in FIG. 2.

The actuator 30 has the piezoelectric element 31, a vibration plate 32, supports 33A and 33B, and fixed portions 34A and 34B, as illustrated in FIG. 2. The vibration plate 32, the supports 33A and 33B, and the fixed portions 34A and 34B may be formed integrally by, for example, bending one thin plate. Alternatively, the vibration plate 32, the supports 33A and 33B, and the fixed portions 34A and 34B may be formed separately from one another. In the case where the vibration plate 32, the supports 33A and 33B, and the fixed portions 34A and 34B are formed separately from one another, the vibration plate 32, the supports 33A and 33B, and the fixed portions 34A and 34B may be integrated by welding or the like.

The piezoelectric element 31 has, for example, a rectangular shape, as illustrated in FIG. 3. A voltage signal output from the controller of the tactile sensation providing apparatus 1 illustrated in FIG. 1 is applied to the piezoelectric element 31. The piezoelectric element 31 undergoes expansion and contraction displacement in the longitudinal direction according to the applied voltage signal. The piezoelectric element 31 may be a piezoelectric film or piezoelectric ceramic. Piezoelectric ceramic can generate vibration having greater vibration energy than a piezoelectric film.

The piezoelectric element 31 may be replaced with a magnetostrictor. A magnetostrictor expands and contracts according to an applied magnetic field. In the case where the piezoelectric element 31 is replaced with a magnetostrictor, the actuator 30 may further have a coil or the like for converting a drive signal output from the controller into a magnetic field.

The vibration plate 32 is, for example, an elastic thin plate such as a shim plate, as illustrated in FIG. 3. The vibration plate 32 may be a platy member with a predetermined thickness. The vibration plate 32 may be made of metal, resin, or a composite material of metal, resin, and the like. Hereafter, of two surfaces of the vibration plate 32, the surface facing the housing 10 is referred to as "main surface 32a", and the surface facing the vibration object 20 is referred to as "main surface 32b", as illustrated in FIG. 2.

The piezoelectric element 31 is provided on the main surface 32a, as illustrated in FIG. 2. The piezoelectric element 31 is provided on the main surface 32a so that the longitudinal direction of the piezoelectric element 31 will match the longitudinal direction of the vibration plate 32. The piezoelectric element 31 may be joined to the main surface 32a using an adhesive or the like.

A structure in which the piezoelectric element 31 is provided on the main surface 32a, i.e. a structure in which the piezoelectric element 31 is provided on one surface of the vibration plate 32, is a unimorph. In the unimorph, the expansion and contraction displacement of the piezoelectric element 31 induces bending vibration of the vibration plate 32. As illustrated in FIG. 2, both ends of the vibration plate 32 are supported by the supports 33A and 33B. In the case where both ends of the vibration plate 32 are supported in this way, the vibration plate 32 vibrates with the amplitude in the normal direction of the main surface 32a around the center of the vibration plate 32 being largest. As a result of the vibration plate 32 vibrating with the amplitude in the normal direction of the main surface 32a, i.e. the X-axis direction, being largest, the vibration object 20 can vibrate in the out-of-plane direction.

The support 33A is provided at one end of the vibration plate 32 in the longitudinal direction, as illustrated in FIG.

2. One end of the support 33A is connected to the vibration plate 32. The other end of the support 33A is connected to the fixed portion 34A. The support 33B is provided at the other end of the vibration plate 32 in the longitudinal direction, as illustrated in FIG. 2. One end of the support 33B is connected to the vibration plate 32. The other end of the support 33B is connected to the fixed portion 34B.

The supports 33A and 33B support the vibration plate 32 so as to create a gap between the piezoelectric element 31 and the housing 10. As a result of a gap being created between the piezoelectric element 31 and the housing 10, when the vibration plate 32 vibrates according to the displacement of the piezoelectric element 31, the piezoelectric element 31 can be prevented from colliding with the housing 10. The supports 33A and 33B may be made of the same material as the vibration plate 32, or made of a different material from the vibration plate 32.

The fixed portions 34A and 34B are fixed to the housing 10, as illustrated in FIG. 2. The fixed portions 34A and 34B may be fixed to the housing 10 using a fastening member such as a screw, an adhesive, or the like. The fixed portions 34A and 34B may be made of the same material as the vibration plate 32, or made of a different material from the vibration plate 32.

The holder 35 abuts the abutment 23 of the vibration object 20 to hold the vibration object 20. The holder 35 may be made of metal, resin, or a composite material of metal, resin, and the like. The holder 35 is provided at or near the center of the main surface 32b of the vibration plate 32. The holder 35 may be connected to the vibration plate 32 using an adhesive or the like.

For example, when the main surface 21 of the vibration object 20 is pressed in the positive direction of the X-axis by the user's finger or the like as illustrated in FIG. 2, the holder 35 abuts the abutment 23 of the vibration object 20. As a result of the holder 35 abutting the abutment 23 of the vibration object 20, the vibration of the vibration plate 32 is transmitted to the vibration object 20 through the holder 35. With such a configuration, the tactile sensation providing apparatus 1 can provide a tactile sensation to the user touching the main surface 21 of the vibration object 20 by vibrating the vibration object 20.

Figure 4:
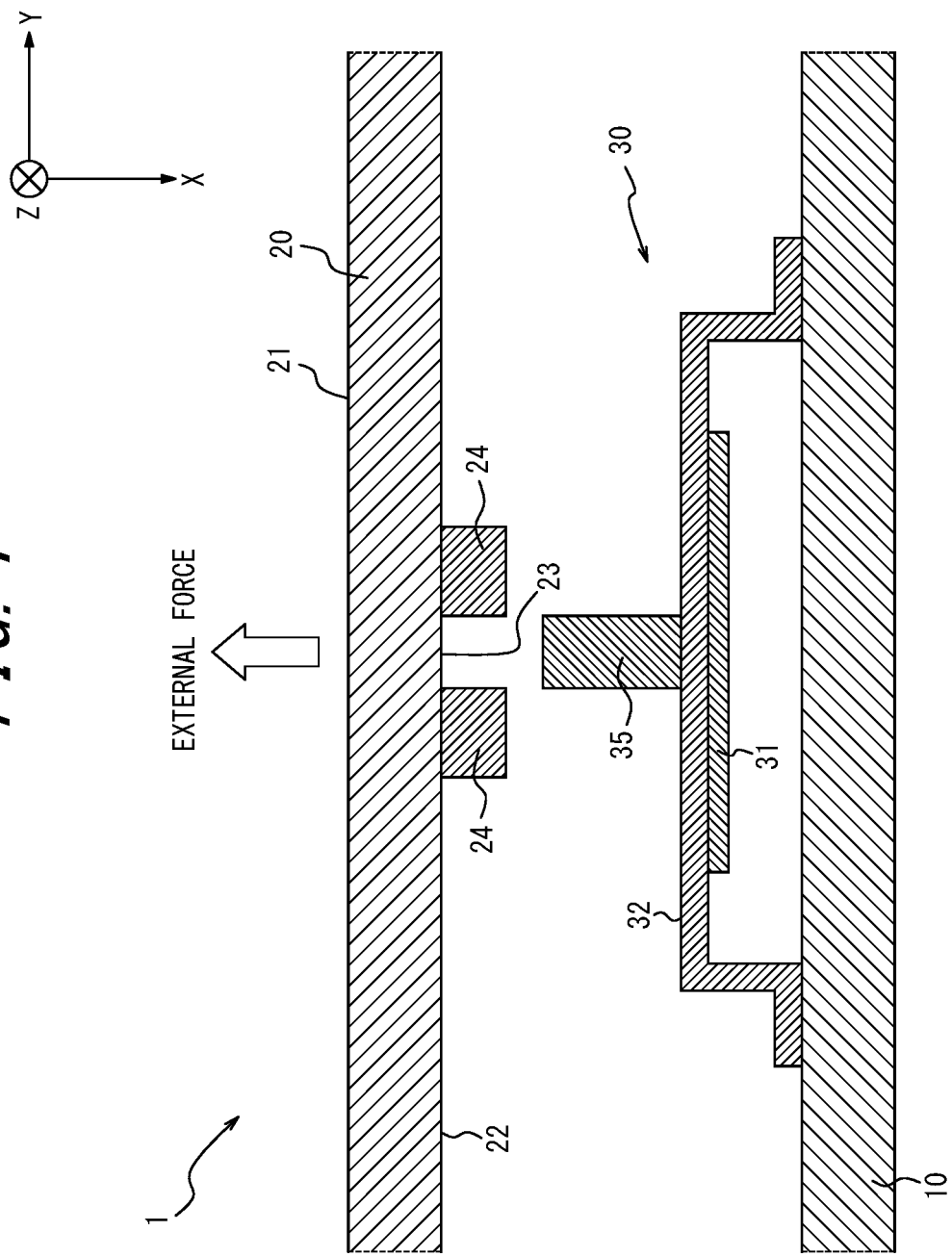
FIG. 4 is a diagram illustrating a state when an external force in the negative direction of the X-axis acts on a vibration object in the configuration illustrated in FIG. 2.

The holder 35 is non-adherent to the abutment 23 of the vibration object 20. The holder 35 may be removable from the abutment 23 of the vibration object 20. When an external force in the negative direction of the X-axis acts on the vibration object 20, the holder 35 separates from the abutment 23 of the vibration object 20. FIG. 4 illustrates a state when an external force in the negative direction of the X-axis acts on the vibration object 20 in the configuration illustrated in FIG. 2. For example, in the case where the tactile sensation providing apparatus 1 illustrated in FIG. 1 is a vehicle-mounted device installed in a vehicle, the traveling direction of the vehicle in which the tactile sensation providing apparatus 1 is mounted may be approximately the positive direction of the X-axis. In this case, when the vehicle starts suddenly, an external force in the negative direction of the X-axis can act on the vibration object 20. In this embodiment, when an external force in the negative direction of the X-axis acts on the vibration object 20, the holder 35 separates from the abutment 23 of the vibration object 20, so that the vibration plate 32 of the actuator 30 can be prevented from being pulled in the negative direction of the X-axis together with the vibration object 20. By preventing the vibration plate 32 of the actuator 30 from being pulled in the negative direction of the X-axis, damage of the piezoelectric element 31 can be prevented.

Comparative Example

Figure 5:
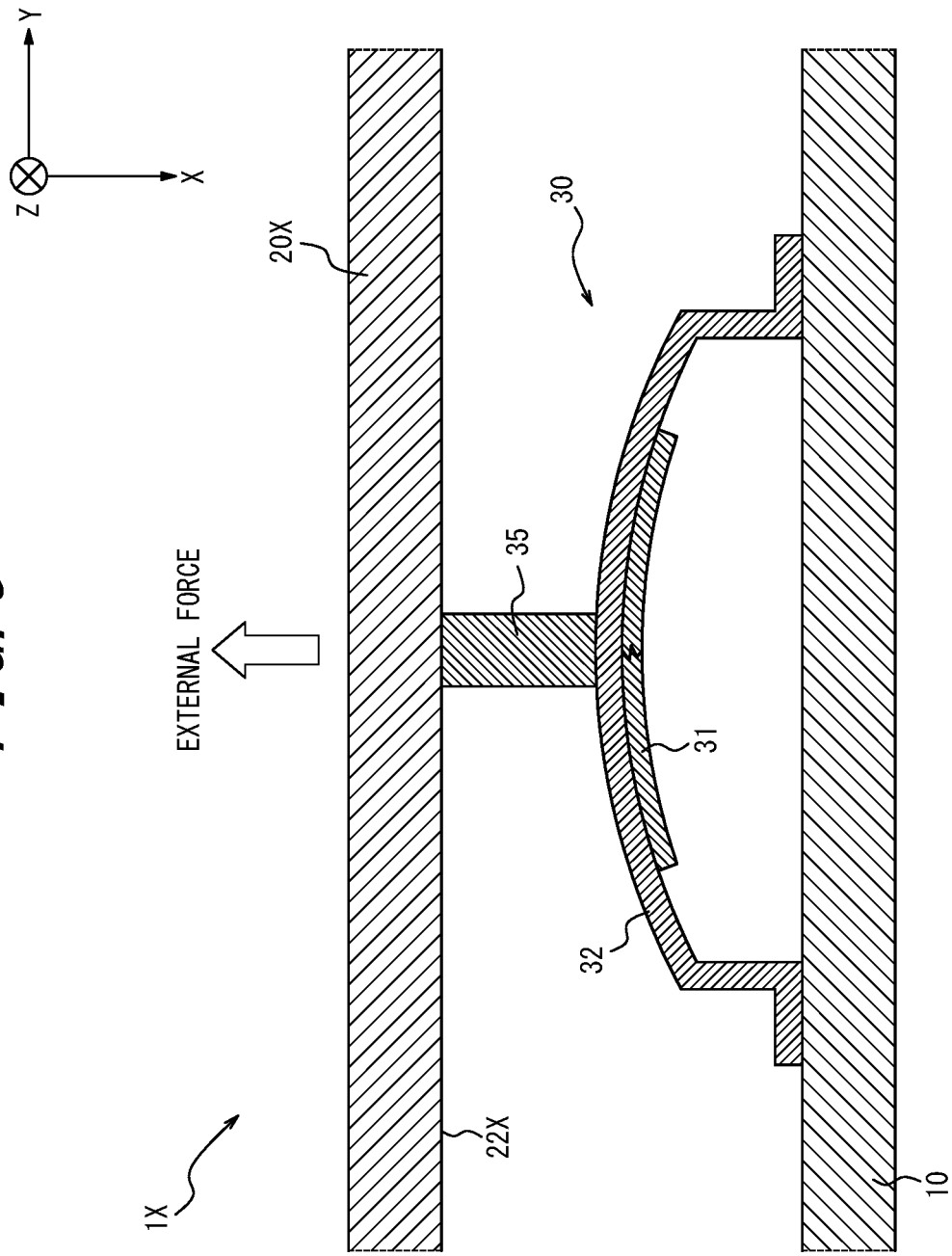
FIG. 5 is a diagram illustrating a tactile sensation providing apparatus according to a comparative example.

FIG. 5 is a diagram illustrating a tactile sensation providing apparatus 1X according to a comparative example. FIG. 5 corresponds to FIG. 4. The tactile sensation providing apparatus 1X according to the comparative example includes the housing 10, a vibration object 20X, and the actuator 30.

In the comparative example, the vibration object 20X has a main surface 22X. The main surface 22X is adhered to the holder 35 of the actuator 30 using an adhesive or the like.

In the tactile sensation providing apparatus 1X according to the comparative example, when an external force in the negative direction of the X-axis acts on the vibration object 20X, the vibration plate 32 of the actuator 30 may be pulled in the negative direction of the X-axis because the main surface 22X is adhered to the holder 35. In the tactile sensation providing apparatus 1X according to the comparative example, the piezoelectric element 31 joined to the vibration plate 32 of the actuator 30 may be damaged as a result of the vibration plate 32 being pulled in the negative direction of the X-axis.

In the tactile sensation providing apparatus 1 according to this embodiment, on the other hand, when an external force in the negative direction of the X-axis acts on the vibration object 20, the holder 35 separates from the abutment 23 of the vibration object 20. With such a configuration, the vibration plate 32 of the actuator 30 can be prevented from being pulled in the negative direction of the X-axis in this embodiment. By preventing the vibration plate 32 of the actuator 30 from being pulled in the negative direction of the X-axis, damage of the piezoelectric element 3114 can be prevented.

Configuration Example of Another Tactile Sensation Providing Apparatus

Figure 6:
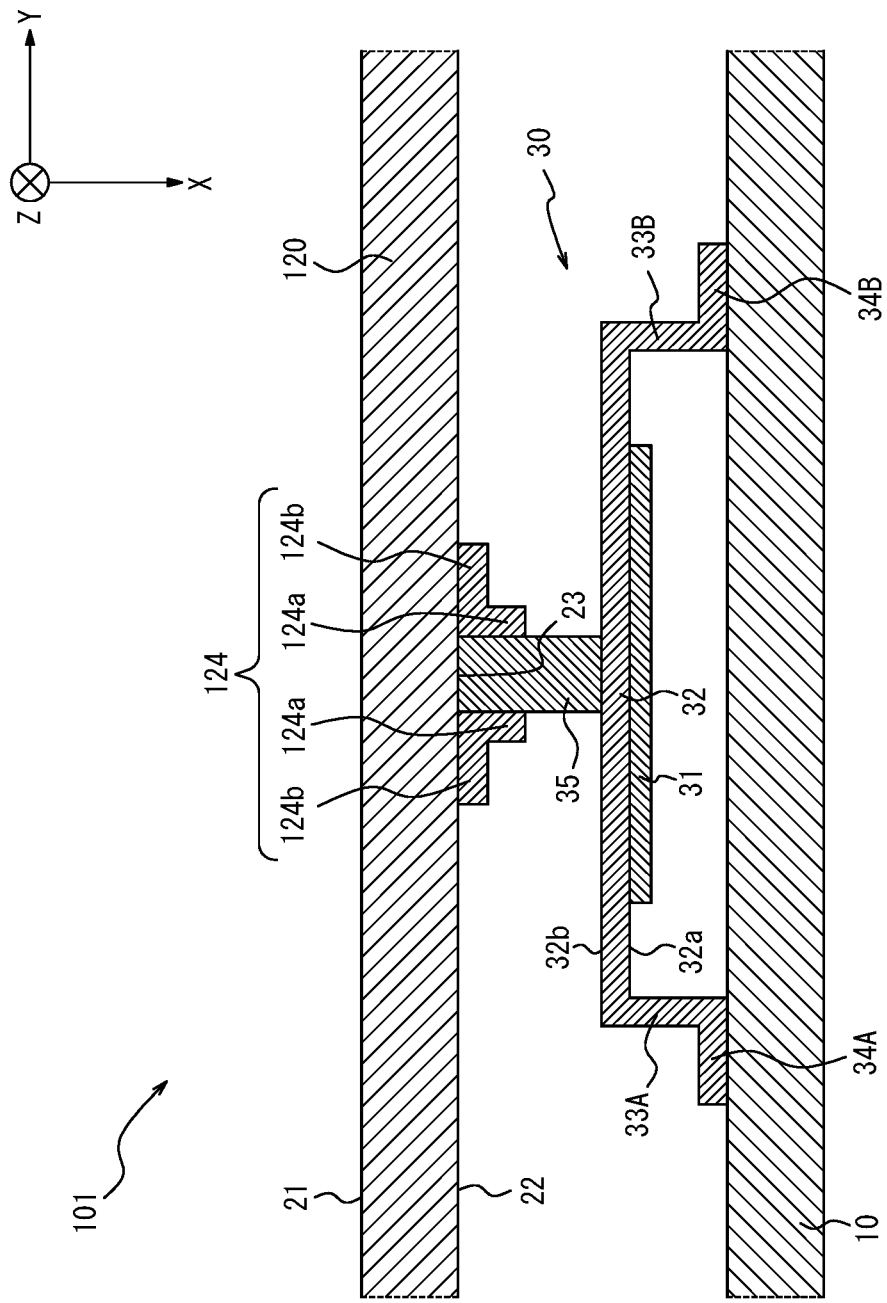
FIG. 6 is a diagram illustrating a tactile sensation providing apparatus according to another embodiment of the present disclosure.

FIG. 6 is a diagram illustrating a tactile sensation providing apparatus 101 according to another embodiment of the present disclosure. The tactile sensation providing apparatus 101 includes the housing 10, a vibration object 120, and the actuator 30. The vibration object 120 includes the main surface 21, the main surface 22, the abutment 23, and a guide 124.

The guide 124 guides the holder 35 of the actuator 30 to the abutment 23 of the vibration object 120. The guide 124 may be formed along the whole periphery of the holder 35 of the actuator 30. Alternatively, the guide 124 may be formed along part of the periphery of the holder 35 of the actuator 30. The guide 124 may be made of metal, resin, or a composite material of metal, resin, and the like.

The guide 124 is L-shaped in a sectional view. The guide 124 includes a portion 124a and a portion 124b.

The portion 124a extends along the outer surface of the holder 35 of the actuator 30. The portion 124b extends along the main surface 22 of the vibration object 120. As a result of the portion 124b extending along the main surface 22, the guide 124 can be fixed to the vibration object 120 more stably.

The other configurations and effects of the tactile sensation providing apparatus 101 are the same as those of the tactile sensation providing apparatus 1 illustrated in FIG. 2.

Configuration Example of Yet Another Tactile Sensation Providing Apparatus

Figure 7:
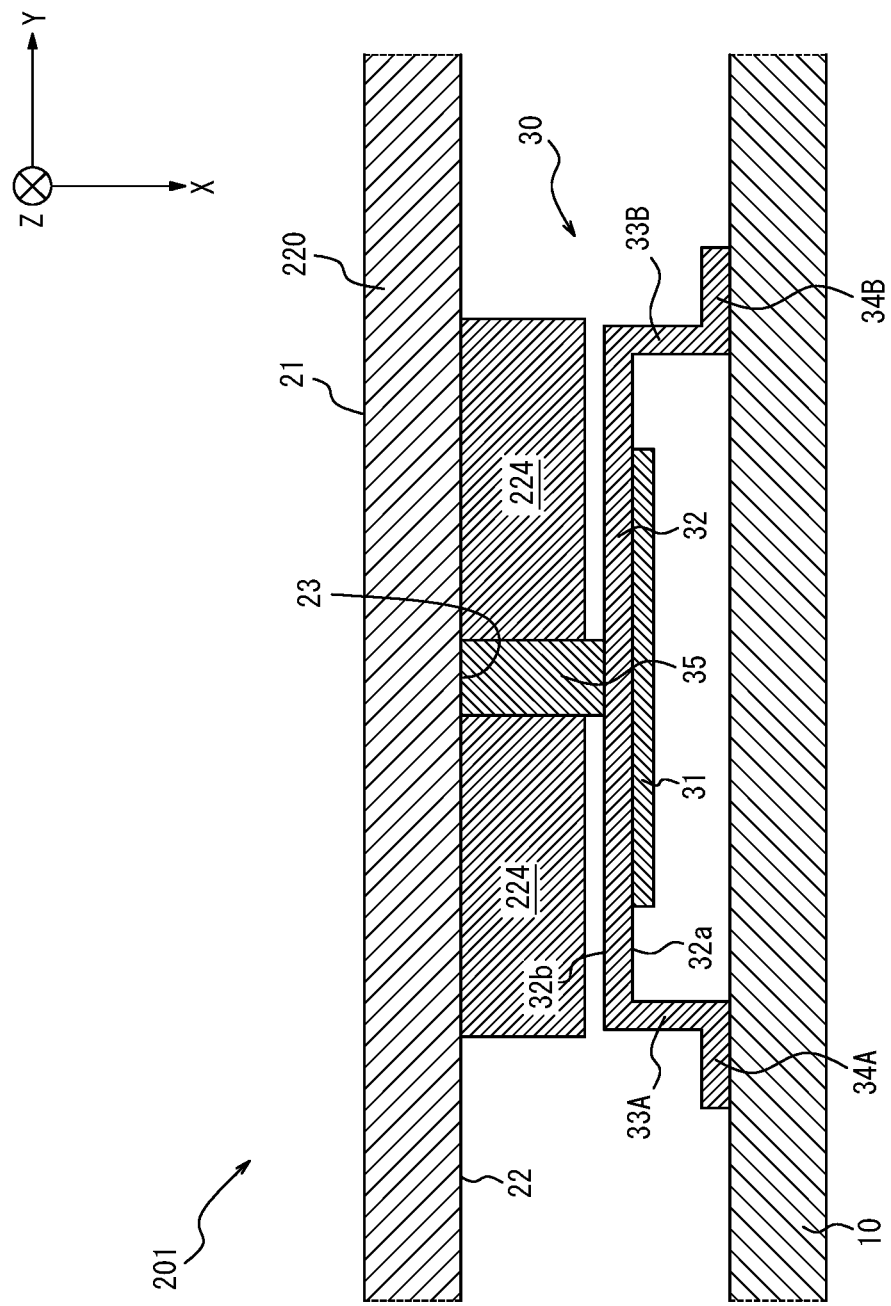
FIG. 7 is a diagram illustrating a tactile sensation providing apparatus according to yet another embodiment of the present disclosure.

FIG. 7 is a diagram illustrating a tactile sensation providing apparatus 201 according to yet another embodiment of the present disclosure. The tactile sensation providing apparatus 201 includes the housing 10, a vibration object 220, and the actuator 30. The vibration object 220 includes the main surface 21, the main surface 22, the abutment 23, and a guide 224.

The guide 224 guides the holder 35 of the actuator 30 to the abutment 23 of the vibration object 220. The guide 224 may be formed along the whole periphery of the holder 35 of the actuator 30. Alternatively, the guide 224 may be formed along part of the periphery of the holder 35 of the actuator 30. The guide 224 may be made of metal, resin, or a composite material of metal, resin, and the like.

A portion of the guide 224 on the negative side of the Y-axis extends from the holder 35 of the actuator 30 to the support 33A of the actuator 30. A portion of the guide 224 on the positive side of the Y-axis extends from the holder 35 of the actuator 30 to the support 33B of the actuator 30.

The length of the guide 224 along the X-axis is shorter than the length of the holder 35 of the actuator 30 along the X-axis. With such a configuration, when the holder 35 abuts the abutment 23 of the vibration object 220, a gap can be created between the guide 224 and the main surface 32b of the vibration plate 32 of the actuator 30, as illustrated in FIG. 7. As a result of a gap being created between the guide 224 and the main surface 32b of the vibration plate 32, the vibration plate 32 can vibrate efficiently according to the expansion and contraction displacement of the piezoelectric element 31.

Figure 8:
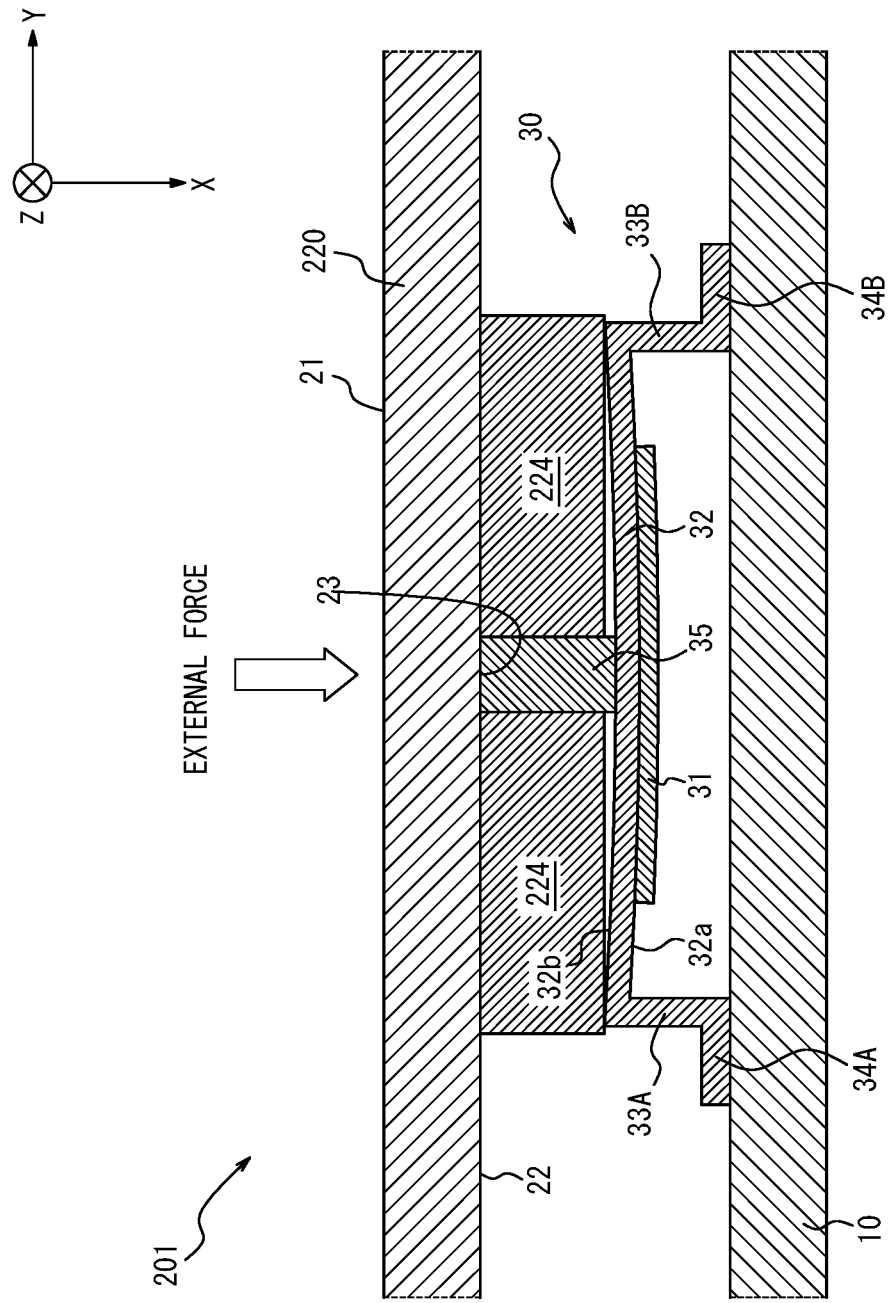
FIG. 8 is a diagram illustrating a state when an external force in the positive direction of the X-axis acts excessively on a vibration object in the configuration illustrated in FIG. 7.

In the tactile sensation providing apparatus 201, even when a force in the positive direction of the X-axis acts excessively on the vibration object 220, damage of the piezoelectric element 31 can be prevented. FIG. 8 is a diagram illustrating a state when an external force in the positive direction of the X-axis acts excessively on the vibration object 220 in the configuration illustrated in FIG. 7. For example, an external force in the positive direction of the X-axis acts excessively on the vibration object 220 when the user presses the vibration object 220 excessively, or when, in the case where the tactile sensation providing apparatus 1 illustrated in FIG. 1 is a vehicle-mounted device installed in a vehicle, the vehicle in which the tactile sensation providing apparatus 1 is mounted stops suddenly. When the vibration object 220 is displaced in the positive direction of the X-axis as a result of an external force in the positive direction of the X-axis acting on the vibration object 220, the support 33A abuts one end of the guide 224, and the support 33B abuts the other end of the guide 224. With such a configuration, even when a force in the positive direction of the X-axis acts excessively on the vibration object 220, the vibration plate 32 can be prevented from being displaced excessively in the positive direction of the X-axis. By preventing the vibration plate 32 from being displaced excessively in the positive direction of the X-axis, damage of the piezoelectric element 31 can be prevented.

The other configurations and effects of the tactile sensation providing apparatus 201 are the same as those of the tactile sensation providing apparatus 1 illustrated in FIG. 2.

Configuration Example of Yet Another Tactile Sensation Providing Apparatus

Figure 9:
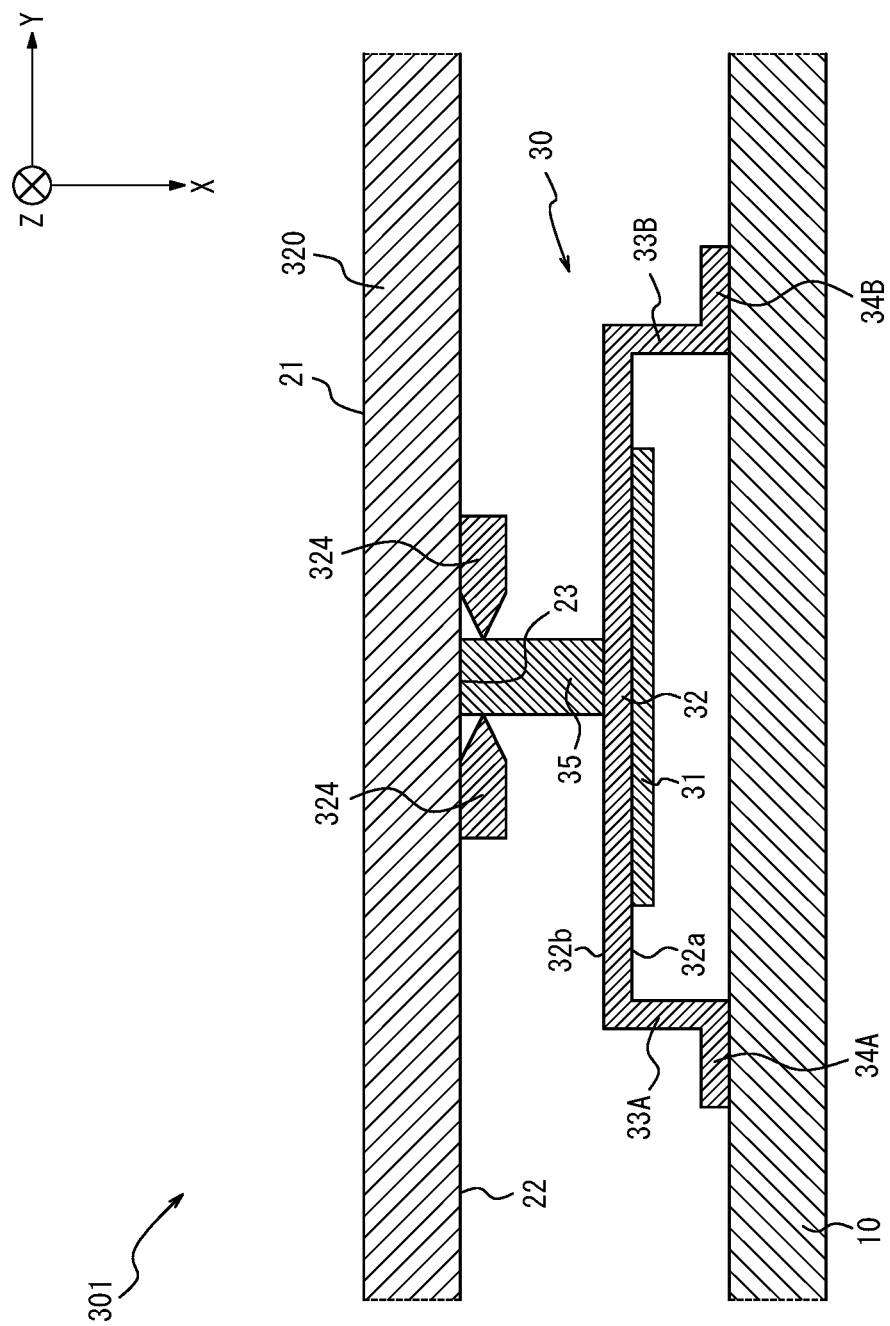
FIG. 9 is a diagram illustrating a tactile sensation providing apparatus according to yet another embodiment of the present disclosure.

FIG. 9 is a diagram illustrating a tactile sensation providing apparatus 301 according to yet another embodiment of the present disclosure. The tactile sensation providing apparatus 301 includes the housing 10, a vibration object 320, and the actuator 30. The vibration object 320 includes the main surface 21, the main surface 22, the abutment 23, and a guide 324.

The guide 324 guides the holder 35 of the actuator 30 to the abutment 23 of the vibration object 320. The guide 324 may be formed along the whole periphery of the holder 35 of the actuator 30. Alternatively, the guide 324 may be formed along part of the periphery of the holder 35 of the actuator 30. The guide 324 may be made of metal, resin, or a composite material of metal, resin, and the like.

The guide 324 is wedge-shaped in a sectional view. The holder 35 is located at a center part of the guide 324. The center part of the guide 324 gradually increases in diameter toward the housing 10. With such a configuration, in the case where an external force in the negative direction of the X-axis acts on the vibration object 320 and the holder 35 separates from the center part of the guide 324, when the external force on the vibration object 320 is released, the holder 35 can be easily guided to the center part of the guide 324. Since the holder 35 can be easily guided to the center part of the guide 324, the holder 35 can be easily guided to the abutment 23 of the vibration object 320. The guide 324 may be flexible. As a result of the guide 324 being flexible, the holder 35 can be guided to the center part of the guide 324 more easily.

The other configurations and effects of the tactile sensation providing apparatus 301 are the same as those of the tactile sensation providing apparatus 1 illustrated in FIG. 2.

While some embodiments of the present disclosure have been described above by way of drawings and examples, various changes or modifications may be easily made by those of ordinary skill in the art based on the present disclosure. Such various changes or modifications are therefore included in the scope of the present disclosure. For example, the functions included in the functional units, etc. may be rearranged without logical inconsistency, and a plurality of functional units, etc. may be combined into one functional unit, etc. and a functional unit, etc. may be divided into a plurality of functional units, etc. Moreover, each of the embodiments according to the present disclosure is not limited to the strict implementation of the embodiment, and features may be combined or partially omitted as appropriate.

For example, although the foregoing embodiments describe the case where the fixed portions 34A and 34B of the actuator 30 are fixed to the housing 10 of the tactile sensation providing apparatus 1, the fixed portions 34A and 34B of the actuator 30 may be fixed to a part other than the housing 10. For example, in the case where the tactile sensation providing apparatus 1 is implemented in a vehicle, the fixed portions 34A and 34B of the actuator 30 may be fixed to a frame of the vehicle.

For example, although the foregoing embodiments describe the case where the actuator 30 causes the vibration object 20 to vibrate vertically, the actuator 30 may cause the vibration object 20 to vibrate horizontally. In this case, the actuator 30 may be placed between the housing 10 and the vibration object 20 so that the main surface 32a of the vibration plate 32 will be perpendicular to the main surface 21 of the vibration object 20 in FIG. 2. The same applies to the vibration objects 120, 220, and 320.

REFERENCE SIGNS LIST 1, 1X, 101, 201, 301 tactile sensation providing apparatus
20, 120, 220, 320 vibration object (structure)

20X vibration object
21, 22, 22X main surface
23 abutment
24, 124, 224, 324 guide
124a, 124b portion
30 actuator
31 piezoelectric element
32 vibration plate
32a, 32b main surface
33A, 33B support
34A, 34B fixed portion
35 holder

The invention claimed is:

1. A structure configured to provide a tactile sensation, the structure comprising:
    an abutment configured to abut an actuator that causes the structure to vibrate according to expansion and contraction displacement of a piezoelectric element,
    wherein the abutment is non-adherent to the actuator,
    the structure further comprises a guide having an inner wall, the inner wall of the guide being configured to contact a holder of the actuator to thereby guide the holder to the abutment such that the contact between the inner wall of the guide and the holder extends along the inner wall of the guide from the structure towards the piezoelectric element,
    the contact between the holder and the guide is removable contact such that the holder can separate from the guide when the holder separates from the abutment, and
    an inner periphery of the inner wall of the guide has a same shape as an outer periphery of the holder.

2. The structure according to claim 1, wherein the abutment is removable from the actuator.

3. A tactile sensation providing apparatus, comprising:
    a structure configured to provide a tactile sensation; and
    an actuator configured to cause the structure to vibrate according to expansion and contraction displacement of a piezoelectric element,
    wherein the structure includes an abutment configured to abut the actuator,
    the abutment is non-adherent to the actuator,
    the structure further includes a guide having an inner wall, the inner wall of the guide being configured to contact a holder of the actuator to thereby guide the holder to the abutment such that the contact between the inner wall of the guide and the holder extends along the inner wall of the guide from the structure towards the piezoelectric element,
    the contact between the holder and the guide is removable contact such that the holder can separate from the guide when the holder separates from the abutment, and
    an inner periphery of the inner wall of the guide has a same shape as an outer periphery of the holder.

4. An apparatus that provides tactile sensation, comprising:
    a vibration object comprising a guide;
    an abutment that is guided by the guide to abut an actuator, and that is non-adherent to the actuator; and
    the actuator comprising a piezoelectric element that vibrates the vibration object through the abutment according to expansion and contraction displacement of the piezoelectric element,
    wherein the guide has an inner wall, the inner wall of the guide being configured to contact a holder of the actuator to thereby guide the holder to the abutment such that the contact between the inner wall of the guide and the holder extends along the inner wall of the guide from the vibration object towards the piezoelectric element,
    the contact between the holder and the guide is removable contact such that the holder can separate from the guide when the holder separates from the abutment, and
    an inner periphery of the inner wall of the guide has a same shape as an outer periphery of the holder.

* * * * *